US011557470B2

(12) United States Patent
Chung et al.

(10) Patent No.: US 11,557,470 B2
(45) Date of Patent: Jan. 17, 2023

(54) SPUTTERING TARGET ASSEMBLY TO PREVENT OVERETCH OF BACKING PLATE AND METHODS OF USING THE SAME

(71) Applicant: Taiwan Semiconductor Manufacturing Company Limited, Hsinchu (TW)

(72) Inventors: Chen-Fang Chung, Zhubei (TW); Wen-Cheng Cheng, Hsinchu (TW); Po Wen Yang, Miaoli County (TW); Ming-Jie He, Hsinchu County (TW); Yan-Zi Lu, Hsinchu (TW); Cheng-Yi Teng, Miaoli County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/862,886

(22) Filed: Jul. 12, 2022

(65) Prior Publication Data
US 2022/0351953 A1 Nov. 3, 2022

Related U.S. Application Data

(62) Division of application No. 16/911,670, filed on Jun. 25, 2020, now Pat. No. 11,424,111.

(51) Int. Cl.
*H01J 37/34* (2006.01)
*C23C 14/34* (2006.01)
*C23C 14/54* (2006.01)

(52) U.S. Cl.
CPC ...... *H01J 37/3435* (2013.01); *C23C 14/3407* (2013.01); *C23C 14/54* (2013.01); *H01J 37/3405* (2013.01); *H01J 37/3447* (2013.01)

(58) Field of Classification Search
CPC ............ H01J 37/32963; H01J 37/3482; H01J 37/3479; H01J 2237/30466;
(Continued)

(56) References Cited

U.S. PATENT DOCUMENTS

| 4,983,269 A | 1/1991 | Wegmann |
| 5,487,823 A | 1/1996 | Sawada et al. |

(Continued)

FOREIGN PATENT DOCUMENTS

| CN | 102230158 A | 11/2011 |
| CN | 108149207 A | 6/2018 |

(Continued)

OTHER PUBLICATIONS

Taiwan Patent and Trademark Office, Application No. 11020977920, Office Action dated Oct. 6, 2021, 13 pages.

(Continued)

*Primary Examiner* — Jennifer Wecker
*Assistant Examiner* — Patrick S Ott
(74) *Attorney, Agent, or Firm* — The Marbury Law Group, PLLC (57) ABSTRACT

A sputtering target assembly, sputtering apparatus, and method, the target assembly including a backing plate having an aperture formed therein; and a target bonded to a front surface of the backing plate. The aperture is disposed on the backing plate such that a first end of the aperture is sealed by a portion of the target that is predicted by a sputtering target erosion profile to have the highest etching rate during a corresponding sputtering process.

20 Claims, 5 Drawing Sheets

(58) Field of Classification Search
CPC ............... H01J 37/3435; H01J 37/3405; H01J 37/3447; C23C 14/3407; C23C 14/54; H01L 22/26
USPC ........................................ 204/298.03, 192.13
See application file for complete search history.

(56) References Cited

U.S. PATENT DOCUMENTS

| | | |
|---|---|---|
| 7,891,536 B2 | 2/2011 | Hsiao et al. |
| 2004/0020769 A1 | 2/2004 | Ivannov et al. |
| 2004/0079634 A1 | 4/2004 | Wickersham, Jr. et al. |
| 2008/0308416 A1 | 12/2008 | Allen et al. |
| 2009/0045051 A1 | 2/2009 | Ferrasse et al. |
| 2009/0266173 A1 | 10/2009 | Kobayashi et al. |
| 2013/0001077 A1 | 1/2013 | Park et al. |
| 2014/0110254 A1 | 4/2014 | Fischer et al. |
| 2014/0311902 A1 | 10/2014 | Ogino et al. |
| 2014/0318953 A1 | 10/2014 | Nagata et al. |
| 2018/0202039 A1 | 7/2018 | Ferrasse et al. |

FOREIGN PATENT DOCUMENTS

| | | |
|---|---|---|
| CN | 109750265 A | 5/2019 |
| JP | H0313572 A | 1/1991 |
| TW | 200732491 A | 9/2007 |
| TW | 201317382 A | 5/2013 |

OTHER PUBLICATIONS

Taiwan Patent and Trademark Office, Application No. 110108783, 2nd Office Action dated Jan. 22, 2022, 10 pages.
Chinese Patent and Trademark Office, Application No. 202110191228.3, Office Action, dated Nov. 2, 2022 9 pages.

SPUTTERING TARGET ASSEMBLY TO PREVENT OVERETCH OF BACKING PLATE AND METHODS OF USING THE SAME

RELATED APPLICATIONS

This application is a divisional application of U.S. application Ser. No. 16/911,670 entitled "Sputtering Target Assembly to Prevent Overetch of Backing Plate and Methods of Using the Same," filed on Jun. 25, 2020, the entire contents of which are incorporated herein by reference for all purposes.

BACKGROUND

Sputter deposition is a physical vapor deposition (PVD) method that is used to form thin films by ejecting material from a target or source material onto a substrate, such as a silicon wafer. A wide variety of parameters may be controlled or altered in order to control and manipulate the manner in which materials using sputter deposition may be formed. The availability of the wide variety of parameters that control sputter deposition result in a complex process, but also allow experts a finer control over the growth and microstructure of films that are deposited using such techniques.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range. As used herein, the term "about" refers to a variation of +/−5%.

The present disclosure is directed to sputtering target assemblies, sputtering apparatuses including the same, and sputtering methods utilizing the sputtering assemblies.

Sputter deposition is a physical vapor deposition (PVD) method that may be used to form thin films. In a sputter deposition process, material from a target or source material may be exposed to energetic particles from a plasma or gas. The exposure to the energetic particles from the of plasma or gas cause particles from the target (also referred to as source material) to be ejected onto a substrate, such as a silicon wafer to form a thin film of the target or source material on the substrate. Sputtered atoms ejected from the target have a wide energy distribution, typically up to tens of eV (100,000 K). The sputtered ions (typically only a small fraction of the ejected particles are ionized—on the order of 1 percent) can ballistically fly from the target in straight lines and impact energetically on the substrates or vacuum chamber (causing resputtering). Alternatively, at higher gas pressures, the ions collide with the gas atoms. The gas atoms may act as a moderator and move diffusively. The sputtered ions may reach the substrates or vacuum chamber wall and condense after undergoing a random walk. The entire range of energy from high-energy ballistic impact to low-energy thermalized motion of the sputtered ions may be modified by changing the background gas pressure. The sputtering gas is often an inert gas such as argon. For efficient momentum transfer, the atomic weight of the sputtering gas should be close to the atomic weight of the target, so for sputtering light elements neon is preferable, while for heavy elements krypton or xenon may be used. Reactive gases can also be used to sputter compounds. The compound can be formed on the target surface, in-flight or on the substrate depending on the process parameters. The ability to vary many parameters that control sputter deposition make it a complex process. However, such granular control allows for a large degree of control over the growth and microstructure of the film during fabrication.

Various embodiments provide a sputtering target assembly comprising: a backing plate having an aperture formed therein; and a target bonded to a front surface of the backing plate. The aperture may be disposed on the backing plate such that a first end of the aperture is sealed by a portion of the target. The aperture may be disposed at a location that is predicted by a sputtering target erosion profile to have the highest etching rate during a corresponding sputtering process. As the sputtering process erodes the target plate, the aperture in the backing plate may be exposed releasing a gas/fluid contained therein. The sputtering chamber may detecting the presence of the contained gas/fluid by pressure or voltage impacts within the chamber indicating a need to halt the sputtering operating and replace the target assembly.

Various embodiments of the present disclosure provide a sputtering apparatus comprising: a deposition chamber; a magnetron; and a sputtering target assembly disposed between the magnetron and the deposition chamber. The sputtering target assembly comprises: a backing plate having an aperture formed therein; and a target bonded to a front surface of the backing plate. The aperture may be disposed on the backing plate such that a first end of the aperture is sealed by a portion of the target. The aperture may be disposed at a location that is predicted by a sputtering target erosion profile to have the highest etching rate during a corresponding sputtering process.

Some embodiments of the present disclosure provide a sputtering method comprising: inserting a sputtering target assembly into deposition chamber of a sputtering apparatus; sputtering the target; and stopping the sputtering if a fluctuation in a sputtering condition is detected.

The various aspects of the methods and structures of embodiments of the present disclosure are now described with reference to the accompanying drawings.

Figure 1:
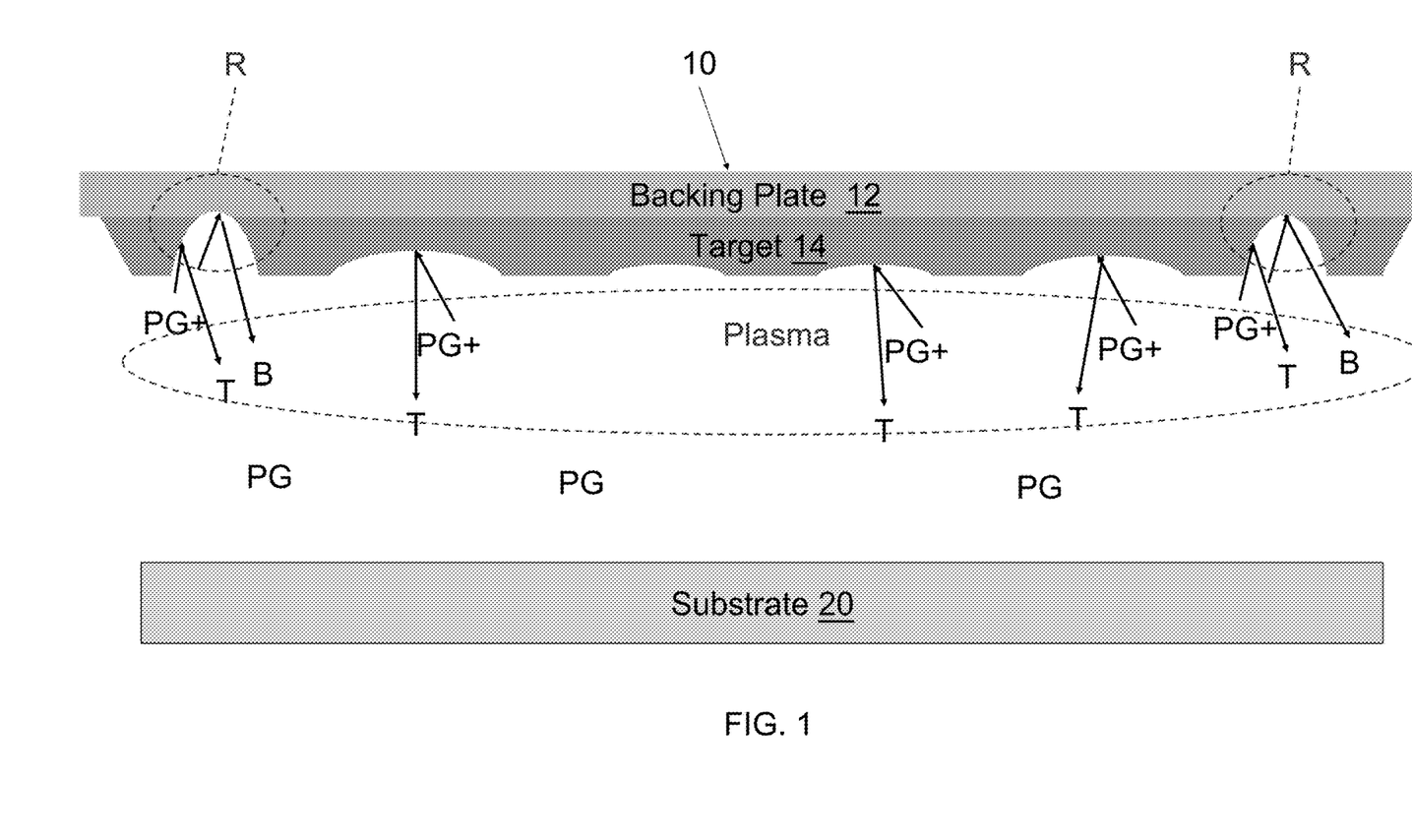
FIG. 1 illustrates the sputtering of a conventional sputtering target assembly.

FIG. 1 illustrates a sputtering target assembly 10 during a sputter deposition operation. Referring to FIG. 1, the sputtering target assembly 10 may include a backing plate 12 and a target 14 disposed thereon. The target 14 may include a material that is intended to be sputtered onto a substrate 20. The backing plate 12 may include a different material than the target 14. The backing plate 12 may be configured to support and electrically bias the target 14. A process gas PG may be introduced into a chamber between the sputtering target assembly 10 and the substrate 20.

During sputtering, a voltage applied to the sputtering target assembly 10 may convert the process gas into a plasma containing process gas ions PG+. The ions PG+ may strike the target 14 at high speeds, thereby releasing target atoms T that may be sputtered onto the substrate 20 to form a thin film of target material.

However, the target 14 may not be uniformly etched by the plasma. In particular, magnetic fields may be used to concentrate electrons in certain portions of the sputtering target assembly 10, thereby generating more plasma adjacent to the concentrated electrons. As a result, certain regions R of the sputtering target assembly 10 may be etched at a higher rate than a remainder of the sputtering target assembly 10. Accordingly, the target layer may be completely etched away in the regions R, exposing the backing plate 12 to the plasma.

In instances in which the sputtering process continues, the backing plate 12 may be etched, thereby releasing backing plate atoms B. As a result, backing plate atoms B may also be sputtered onto the substrate 20. In instances in which the backing plate 12 is formed from a different material than the target 14, the backing plate atoms B may contaminate the desired thin film formed from ejected atoms of the target 14 material formed on the substrate 20.

However, sputtering assemblies and devices generally cannot promptly detect the exposure of a backing plate 12. As such, a substantial amount of backing plate 12 material may be sputtered onto the substrate 20 before the sputtering process may be halted. As a result, the substrate 20 that is exposed to such processes may be rendered unsatisfactory and unusable.

In order to avoid such contamination, the sputtering process may be stopped before a backing plate 12 of the sputtering target assembly 10 is exposed. However, such stoppage of the sputtering process may be inefficient as a substantial amount of target 14 material may be left unused. Accordingly, there is a need for improved sputtering devices and methods that avoid product contamination and improve target 14 material utilization.

Figure 2A:
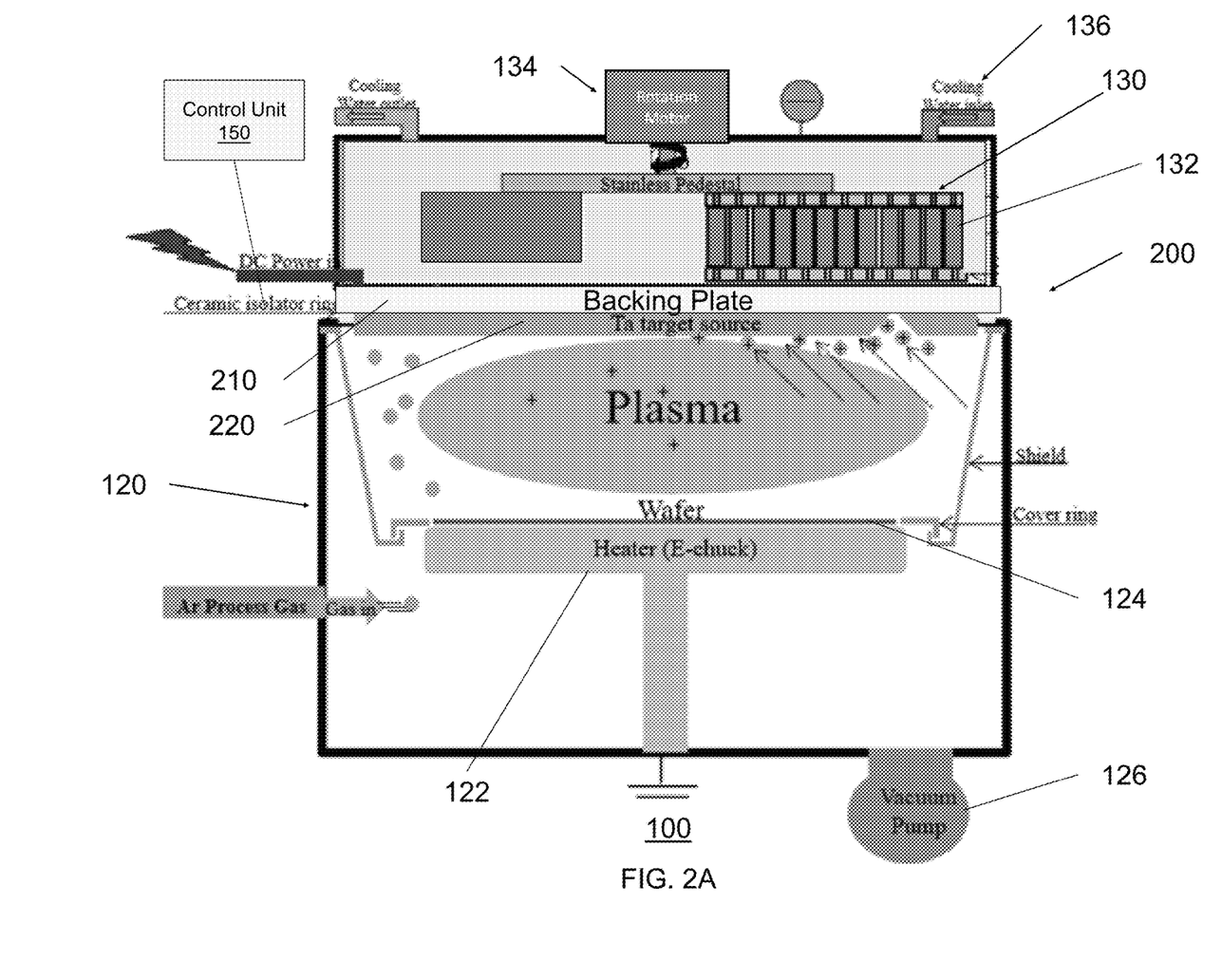
FIG. 2A is a schematic view of a sputtering apparatus, according to various embodiments of the present disclosure.
Figure 2B:
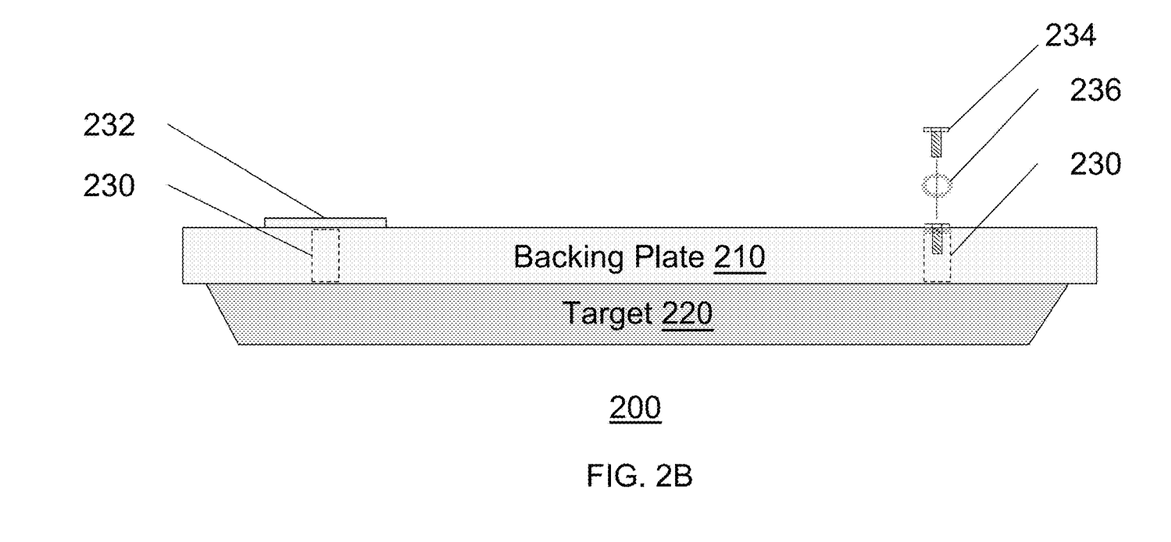
FIGS. 2B and 2C are cross-sectional views of target assemblies that may be included in the sputtering apparatus 100 of FIG. 2A.

FIG. 2A is a schematic view of a sputtering apparatus 100, according to various embodiments of the present disclosure. FIGS. 2B and 2C are cross-sectional views of embodiment sputtering target assemblies 200 that may be included in the sputtering apparatus 100 of FIG. 2A. Referring to FIGS. 2A and 2B, the sputtering apparatus 100 may include a deposition chamber 120 disposed on a first side of the sputtering target assembly 200 and a magnetron 130 disposed on a second side of the sputtering target assembly 200. The deposition chamber 120 may include a chuck 122, for example an electrostatic chuck (ESC). The chuck 122 may be configured to support a substrate 124, such as a semiconductor wafer. The chuck 122 may be further configured to heat the substrate 124 and may be electrically grounded.

The deposition chamber 120 may be at least partially evacuated by a vacuum pump 126. The deposition chamber 120 may be filled with a processing gas. The processing gas may be chemically inert with respect to a sputtered target material. For example, the processing gas may include argon, krypton, xenon, neon, nitrogen ($N_2$), or the like. In other embodiments, the processing gas may be configured to react with a sputtered target material to form oxides or nitrides thereof. For illustrative purposes, FIG. 2A depicts an argon processing gas inlet. However, as discussed above, other processing gases may be utilized.

The magnetron 130 may include a magnet assembly 132 configured to apply a magnetic field to the sputtering target assembly 200. Generally, the magnet assembly 132 may include permanent magnets. However, electromagnets may be used in some embodiments. In some embodiments, the magnet assembly 132 may be rotated within the magnetron 130 by a motor 134. A cooling fluid, such as water, may be supplied to the magnetron 130 via cooling fluid inlet 136 to prevent overheating of the sputtering target assembly 200.

The sputtering target assembly 200 may include a backing plate 210 and a target 220 coupled to a front side of the backing plate 210. During operation, a voltage may be applied to the sputtering target assembly 200, such that the sputtering target assembly 200 operates as a cathode (e.g., is negatively charged). The chuck 122 may be electrically grounded and thus, may operate as an anode. The voltage applied to the sputtering target assembly 200 may cause free electrons to flow from the negatively charged target 220 material. The free electrons may collide with the outer electronic shell of the inert gas atoms (e.g., argon gas). The free electrons may strip electrons from the inert gas due to their like negative charge. As a result, a plasma may be generated comprising positively charge inert gas ions.

The positively charged inert gas ions are attracted to the negatively charged target 220. In particular, the magnet assembly 132 may operate to confine electrons over the negatively charged target 220, enhancing both the efficiency of the initial ionization process and allowing plasma to be generated at lower pressures. During a collision cascade, this attraction ultimately causes positively charged inert gas ions to strike the target 220 at an extremely high velocity. The bombarding positively charged inert gas ions may have sufficient force to dislodge and eject (sputter off) atoms from the face of the target 220. The atoms from the target 220 cross the evacuated deposition chamber 120 and may be precisely deposited in a typical line-of-sight cosine distribution on the substrate 124 surface as a thin film of target 220 material.

The sputtering apparatus 100 may include control unit 150, such as a central processing unit. The control unit 150 may be configured to monitor the voltage applied to the sputtering target assembly 200 during sputtering. The control unit 150 may further detect any a voltage instabilities. For example, the control unit 150 may detect voltage instabilities generated by electrical arcing within the deposition chamber 120. The control unit 150 may also be configured to monitor a vacuum level within the deposition chamber 120 to detect any vacuum instabilities (i.e., pressure variations) in the evacuated deposition chamber 120. For example, the control unit 150 may be configured to detect an increase or decrease in the pressure within the deposition chamber 120.

If the control unit 150 detects a voltage and/or vacuum instability, the control unit 150 may generate an alarm, such as DC power instability alarm and/or a loss of vacuum alarm, and immediately halt the sputtering process. As such, the control unit 150 may be configured to reduce and/or prevent sputtering of the backing plate 210 material, as discussed in detail below.

The target 220 may be bonded to a front side of the backing plate 210, using any suitable bonding method. For example, the target 220 may be diffusion-bonded, brazed, or welded to the backing plate 210. Other bonding processes are within the contemplated scope of disclosure. The backing plate 210 may provide mechanical strength, electrical conductivity, and thermal conductivity to the sputtering target assembly 200. For example, the backing plate 210 may be formed of copper, non-magnetic stainless steel (SS 316 or SS 304), molybdenum, aluminum, titanium, alloys thereof such as aluminum-copper alloys, or the like. Other suitable materials for the backing plate 210 are within the contemplated scope of disclosure. The target 220 may be formed of any sputterable material. For example, the target 220 may be formed of aluminum, copper, cobalt, tantalum, titanium, cobalt, platinum, gold, silver, lead, alloys thereof, or the like. Other suitable materials for the target 220 are within the contemplated scope of disclosure.

In some embodiments, the backing plate 210 and the target 220 may be formed of different materials. For example, the target 220 may be formed of tantalum, titanium, cobalt, platinum, etc., while the backing plate 210 may be formed of copper, non-magnetic stainless steel (SS 316 or SS 304), aluminum, etc.

In other embodiments, the backing plate 210 and the target 220 may be formed of the same material. For example, the backing plate 210 and the target 220 may be formed of copper, titanium, an aluminum copper alloy, etc. In such embodiments, the backing plate 210 may be heat-treated to have a higher mechanical strength than the target 220.

Figure 2C:
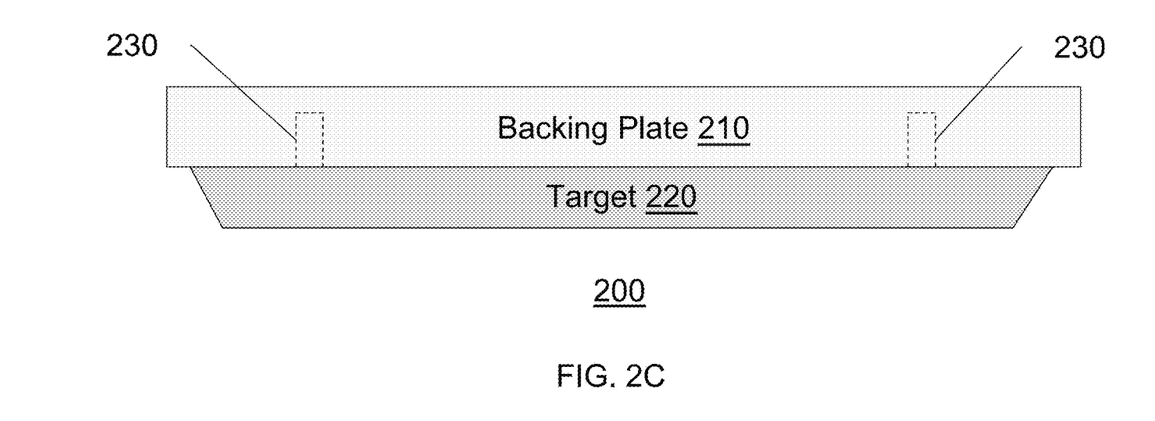

With reference to FIGS. 2B and 2C, the backing plate 210 may include one or more apertures 230. The apertures 230 may be disposed at adjacent portions of the target 220 that experience relatively high magnetic flux, as compared to other regions of the target 220. In other words, the apertures 230 may be disposed adjacent to portions of the target 220 that experience the highest etching rates during sputtering. These portions that experience the highest etch rates during sputtering may be due to variations in the magnetic field applied thereto by the magnetron 130. Due to the magnetic fields that are generated within the deposition chamber 120, the concentration of positively charged inert gas ions may collide with certain areas of the target 220. This concentration of positively charged inert gas ions colliding with the target 220 in certain areas may result in etching of the target 220 to expose at least one aperture 230 formed in the backing plate 210. In some embodiments, the apertures 230 may be positioned based on a predicted target erosion profile of a corresponding sputtering apparatus. The sputtering erosion profile may predict the certain regions or areas of the target 220 that may experience the highest etching rate during a corresponding sputtering.

The apertures 230 may be formed before or after the backing plate 210 is bonded to the target 220. For example, as shown in FIG. 2B, the backing plate 210 may be bonded to target 220 using any of a variety of bonding methods. After the backing plate 210 is bonded to the target 220, the apertures 230 may be formed by drilling through the back surface of the backing plate 210. For example, the apertures 230 may be through-holes that extend through the backing plate 210 in a direction substantially perpendicular to a plane of the backing plate 210.

The bonded target 220 may operate to seal a first end of each aperture 230. An opposing second end of each aperture 230 may be sealed using a non-magnetic, liquid-tight sealing element configured to prevent cooling water from entering the apertures 230. For example, a thin, non-magnetic metal sheet 232, such as aluminum foil sheet, may be attached using an adhesive or welded to the back surface of the backing plate 210, to seal each aperture 230. In the alternative, a non-magnetic screw 234 and a water-proof O-ring 236 may be used to seal each aperture 230.

In some embodiments, a fluid may be sealed in the apertures 230. For example, the fluid may be deionized water, air, a detectable gas, or the like. In various embodiments, the apertures 230 may be configured to contain an amount of the fluid sufficient to trigger an alarm in the sputtering apparatus 100, when the fluid contained in at least one of the apertures 230 is released into the deposition chamber 120 during sputtering operations. For example, each aperture 230 may have a diameter ranging from about 1 millimeter (mm) to about 5 mm, such as from about 2 mm to about 4 mm, or about 3 mm. Apertures 230 of greater or lesser diameters may also be used. In other embodiments, the apertures 230 may be filled with a volume of gas sufficient to trigger an alarm in the sputtering apparatus 100 when the gas contained in the aperture 230 is released from at least one of the apertures 230 into the deposition chamber 120 during sputtering operations. In other embodiments, the apertures 230 may be filled with a gas such that an alarm in the sputtering apparatus 100 may be triggered the gas contained in the aperture 230 is released from at least one of the apertures 230 into the deposition chamber 120 and detected by sensors in the deposition chamber 120 during sputtering operations.

Referring to FIG. 2C, the apertures 230 may not completely penetrate the backing plate 210. For example, the apertures 230 may be formed in the front surface of the backing plate 210, prior to bonding the backing plate 210 to the target 220. For example, the apertures 230 may be drilled into the front side of the backing plate 210, such that the apertures 230 do not completely penetrate the backing plate 210. For example, a first end of each aperture 230 may be sealed by portions of the backing plate 210 having a thickness ranging from about 1 mm to about 4 mm, such as from about 2 mm to about 3 mm, although greater or lesser thicknesses may be used. The target 220 may then be bonded to the front of the backing plate, to seal an opposing second end of each the aperture 230.

In this manner, the apertures 230 may be configured to contain an amount of fluid (e.g., a liquid or gas) sufficient to trigger an alarm in the sputtering apparatus 100 when the fluid contained in the aperture 230 is released from at least one of the apertures 230 into the deposition chamber 120 during sputtering operations. In other embodiments, the apertures 230 may be filled with a volume of fluid sufficient to trigger an alarm in the sputtering apparatus 100 when the fluid contained in the aperture 230 is released from at least one of the apertures 230 into the deposition chamber 120 during sputtering operations. For example, if an aperture 230 containing deionized (DI) water is ruptured during sputtering, the DI water may enter the deposition chamber 120, which may increase the pressure inside of the chamber 120. As a result, a chamber interlock may trigger the closure of a vacuum pump gate valve and a process stop alarm.

In other embodiments, the apertures 230 may be filled with a gas (e.g., air or other non-process gas) such that an alarm in the sputtering apparatus 100 may be triggered when the gas contained in the aperture 230 is released into the deposition chamber 120. For example, the sputtering control unit 150 may include and/or be connected to a fault detection and classification (FDC) system configured to detect fluctuations in sputtering conditions in the deposition chamber 120. For example, the FDC system may be configured to pressure changes in the deposition chamber 120. For example, the FDC system may detect a pressure changes of $0.5\ e^{-2}$ mTorr, such as $1.0\ e^{-2}$ mTorr. In other embodiments, a change in the composition of the gas in the deposition chamber 120, due to release of fluid from a ruptured aperture 230 may be detected by sensors in the deposition chamber 120 during sputtering operations.

In some embodiments, such as when the metal sheet 232 is utilized to seal on end of the apertures 230 as shown in FIG. 2B, rupturing of the aperture 230 may result in deformation of the metal sheet 232, due to the vacuum conditions inside of the deposition chamber 120. In particular, the metal sheet 232 may be deformed into the ruptured aperture 230. The sputtering apparatus 100 may include an optical detection system configured to optically detect the deformation of the metal sheet 232. If deformation of the metal sheet 232 is detected, the control unit 150 may be configured to stop sputtering operations. In addition, the deformation of the metal sheet 232 may be used to visually confirm that the corresponding aperture 230 has been breached.

In other embodiments, an alarm may be triggered based on power fluctuations that occur when an aperture 230 is ruptured and a fluid contained therein is released in to the deposition chamber 120. For example, the fluid may cause fluctuations in a voltage and/or current applied to the sputtering target assembly 200. If the voltage and/or current fluctuations exceed a preset level, the FDC system may trigger a system alarm and stop the sputtering process.

Figure 3:
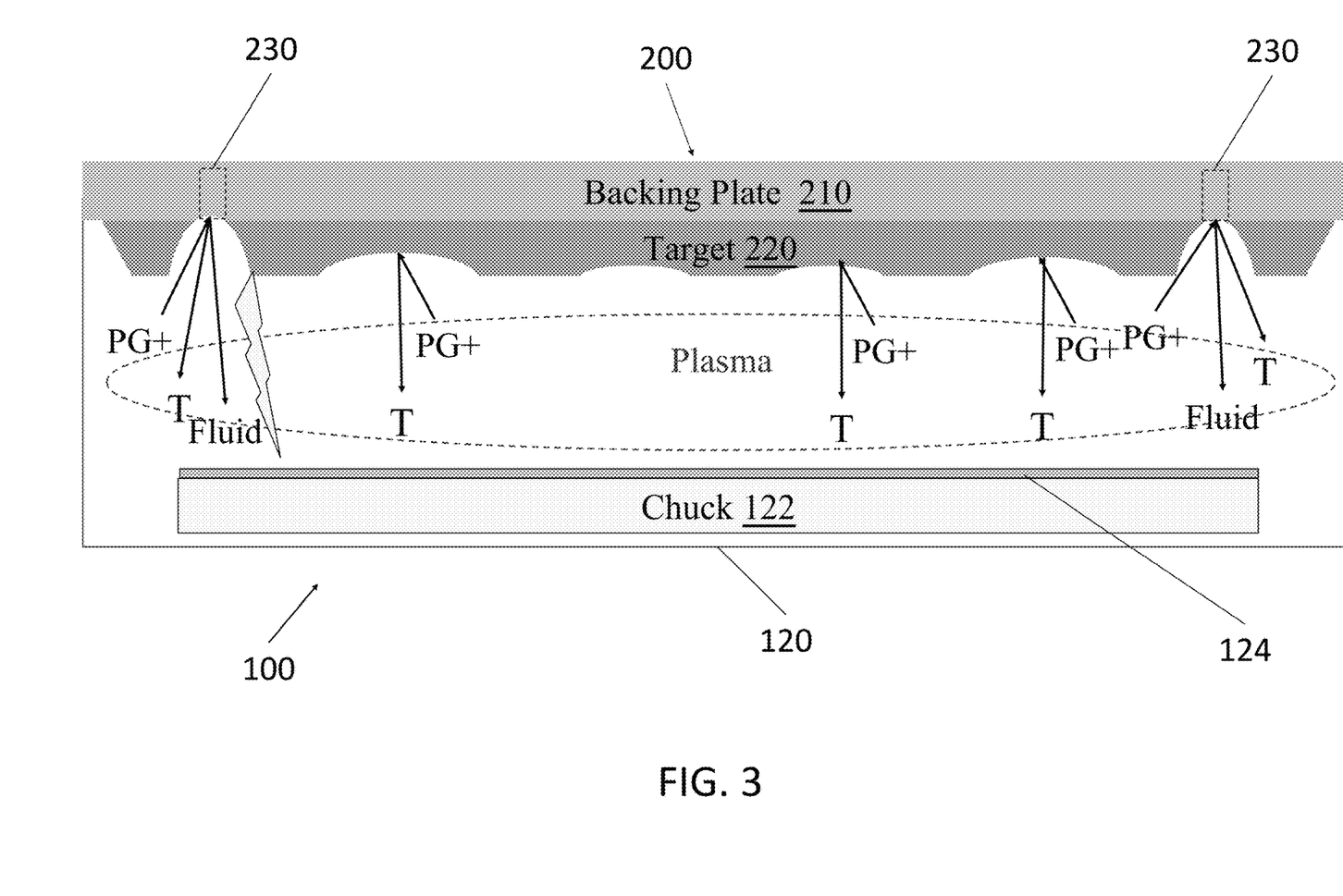
FIG. 3 illustrates the sputtering of a target assembly using the sputtering apparatus of FIG. 2A, according to various embodiments of the present disclosure.

FIG. 3 illustrates the sputtering operations using an embodiment sputtering target assembly 200 of either FIG. 2B or 2C in the sputtering apparatus 100 of FIG. 2A. As shown in FIG. 3, the sputtering target assembly 200 includes the backing plate 210 bonded to target 220. In addition, the sputtering target assembly 200 includes apertures 230 formed in the backing plate 210. As the sputtering operation progresses, the target 220 is continually etched to form the thin film of target 220 material on the substrate 124 (i.e., silicon wafer) that is supported by the chuck 122. Due to the magnetic fields that are generated within the deposition chamber 120, the concentration of positively charged inert gas ions may collide with certain areas of the target 220. This concentration of positively charged inert gas ions colliding with the target 220 in certain areas may result in etching of the target 220 to expose at least one aperture 230 formed in the backing plate 210. The exposure of the aperture 230 releases the fluid stored therein into the deposition chamber 120. The released fluid may increase the pressure within the deposition chamber 120 and/or may result in fluctuations in the voltage and/or current applied to sputtering target assembly 200 and/or the chuck 122. The detected increase in pressure and/or detection of the released fluid within the deposition chamber 120 may trigger and alarm to halt the sputtering operation. The sputtering target assembly 200 may be replaced within the sputtering apparatus in order to prevent undesired sputtering of the backing plate 210 material. In this manner the contamination of the desired thin films deposited on the substrate 124 may be avoided. In addition, efficient usage of the target 220 material may be achieved.

Figure 4:
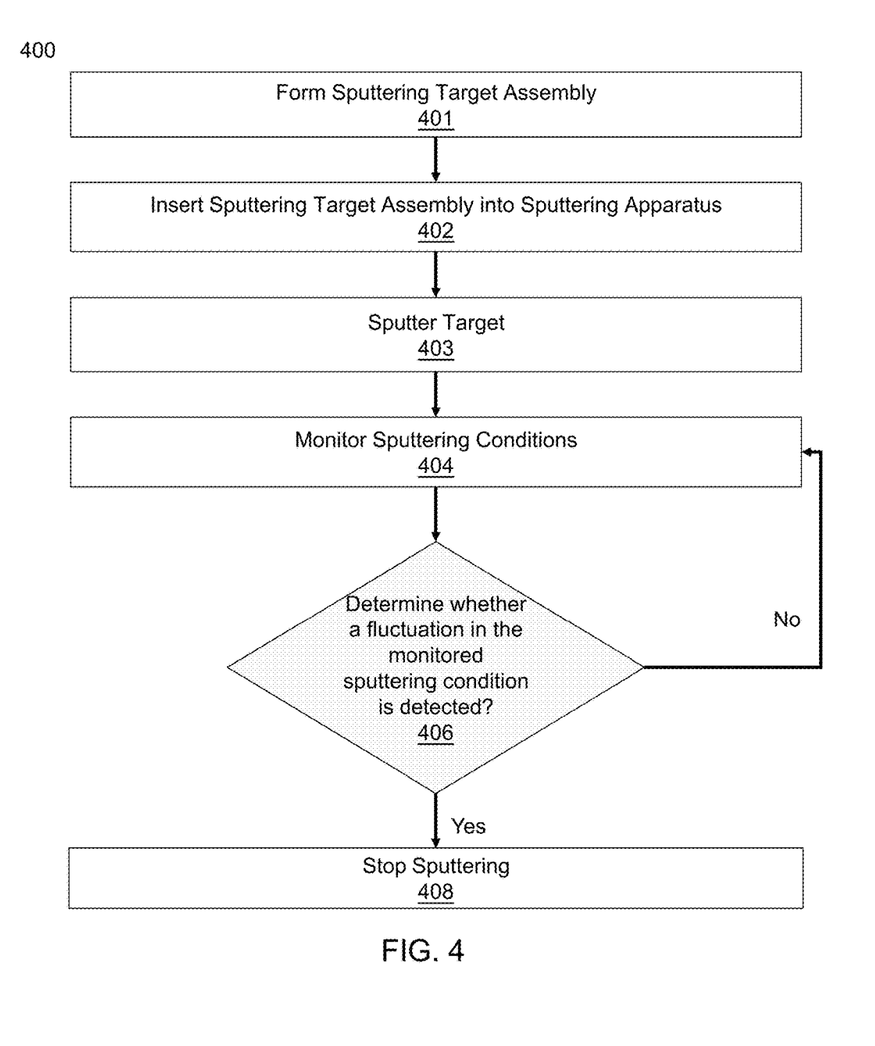
FIG. 4 is a process flow diagram of a sputtering method, according to various embodiments of the present disclosure.

FIG. 4 is a block diagram of a sputtering method 400, according to various embodiments of the present disclosure. Referring to FIG. 4, in step 401 a sputtering target assembly 200 may be formed. In particular, a sputtering target assembly 200 as described above with respect to FIG. 2B may be formed by bonding a target 220 to the front side of a backing plate 210, forming apertures 230 in the backing plate 210 by drilling into the backside of the backing plate 210, and then sealing openings of the apertures 230 using a sealing device 232, 234, 236 after bonding the target 220 to the front side of a backing plate 210.

In the alternative, a sputtering target assembly 200 as described above with respect to FIG. 2C may be formed by forming apertures 230 that do not extend completely through a backing plate 210, by drilling holes into the front side of the backing plate 210. The apertures 230 may be sealed by bonding a target 220 to the front side of the backing plate 210.

In step 402, the sputtering target assembly 200 may be inserted into a sputtering apparatus 100. In step 403, the sputtering operation may be initiated to sputter the target 220. As part of the sputtering operation, a deposition chamber 120 of the sputtering apparatus 100 may be at least partially evacuated, and a process gas may be supplied to the deposition chamber 120. In addition, a voltage may be applied to the target 220 to initiate sputtering of the target 220.

In step 404, sputtering conditions may be monitored by a control unit 150 and/or FDC of the sputtering apparatus 100. For example, the control unit 150 may monitor the stability of the power (e.g., voltage and/or current) applied to the sputtering target assembly 200 and/or may monitor the stability of a vacuum level within the deposition chamber 120.

In step 406, the control unit 150 may determine whether a fluctuation in sputtering conditions has occurred. For example, the control unit 150 may determine whether a power fluctuation, such as a voltage and/or current fluctuation indicating electrical arcing or an electrical conductivity change has occurred in the deposition chamber 120 and/or that a vacuum level in the deposition chamber 120 has decreased. If the target 220 is etched such that the first end of the aperture 230 is unsealed, any fluid contained within the aperture 230 may be released and enter the deposition chamber 120. Such a release of fluid may cause a fluctuation in the vacuum level of the deposition chamber 120. Either condition may indicate that over-etching of the target 220 has occurred, an aperture 230 in the backing plate 210 has been exposed, and a fluid such as Di water, air, or another gas other than the processing gas has been released into the deposition chamber 120.

In response to the control unit 150 determining that a fluctuation is not detected (e.g., determination 406=No), the method returns to step 404. In this manner, the sputtering of the target 220 may etch the target 220 until the first end of the aperture 230 is unsealed. In response to the control unit 150 determining that a fluctuation is detected (e.g., determination 406=Yes), the method proceeds to step 408. In step 408, an alarm is generated and the sputtering process is immediately stopped. As such, the sputtering process may be stopped before a deposition film formed on a substrate is contaminated with any or any significant amount of material sputtered from the backing plate 210.

Referring to all drawings and according to various embodiments of the present disclosure, a sputtering target assembly 200 is provided and includes a backing plate 210 having an aperture 230 formed therein. The sputtering target assembly 200 also includes a target 220 bonded to a front surface of the backing plate 210, wherein the aperture 230 is disposed on the backing plate 210 such that a first end of the aperture 230 is sealed by a portion of the target 220 that is predicted by a sputtering target erosion profile to have the highest etching rate during a corresponding sputtering process.

Referring to all drawings and according to various embodiments of the present disclosure, a sputtering apparatus 100 is provided. The sputtering apparatus 100 may include a deposition chamber 120; a magnetron 130; and a sputtering target assembly 200 disposed between the magnetron 130 and the deposition chamber 120, the sputtering target assembly 200 includes a backing plate 210 having an aperture 230 formed therein. The sputtering target assembly 200 also includes a target 220 bonded to a front surface of the backing plate 210, wherein the aperture 230 is disposed on the backing plate 210 such that a first end of the aperture 230 is sealed by a portion of the target 220 that is predicted by a sputtering target erosion profile to have the highest etching rate during a corresponding sputtering process.

Referring to all drawings and according to various embodiments of the present disclosure, a sputtering method 400 may be provided. The sputtering method may include the operations of inserting a sputtering target assembly 200 into deposition chamber 120 of a sputtering apparatus 100. The sputtering target assembly 200 includes a backing plate 210 having an aperture 230 formed therein. The sputtering target assembly 200 also includes a target 220 bonded to a front surface of the backing plate 210, wherein the aperture 230 is disposed on the backing plate 210 such that a first end of the aperture 230 is sealed by a portion of the target 220 that is predicted by a sputtering target erosion profile to have the highest etching rate during a corresponding sputtering process. The sputtering method 400 may continue to perform the operation 403 of sputtering the target 220. As the operation 403 of sputtering the target 220 continues, a control unit 150 may monitor a sputtering condition within the sputtering apparatus 100 (operation 404). The control unit 150 may determine whether a fluctuation in the monitored sputtering condition is detected (determination 406); and halt the sputtering of the target 220 in response to determining that a fluctuation in the monitored sputtering condition is detected.

The various embodiment assemblies, apparatus and methods allow for the formation of thin films on a substrate through a sputtering operation. The embodiment assemblies, apparatus and methods provide for an efficient utilization of the target 220 material while preventing over-etching of the backing plate 210 such that the formed thin film on the substrate 124 is contaminated with material from the backing plate 210.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sputtering method comprising:
   inserting a sputtering target assembly into a deposition chamber of a sputtering apparatus, the sputtering target assembly comprising:
   a backing plate having a through-hole formed therein;
   a metal foil attached to a back surface of the backing plate so as to seal a first end of the through-hole; and
   a target bonded to a front surface of the backing plate, such that a second end of the through-hole is sealed by a portion of the target that is predicted by a sputtering target erosion profile to have a highest etching rate during a corresponding sputtering process,
   sputtering the target;
   monitoring the metal foil to detect whether the metal foil is deformed; and
   halting the sputtering of the target in response to detecting that the metal foil is deformed.

2. The method of claim 1, wherein the monitoring the metal foil comprises using an optical detection system to detect deformation of the metal foil into the through-hole.

3. The method of claim 1, wherein the sputtering the target comprises etching the target until the second end of the through-hole is unsealed.

4. The method of claim 1, further comprising attaching the metal foil to the back surface of the backing plate using an adhesive.

5. The method of claim 1, further comprising welding the metal foil to the back surface of the backing plate.

6. The method of claim 1, wherein:
   the backing plate comprises a second through-hole formed therein; and
   the sputtering target assembly comprises a second metal foil attached to the back surface of the backing plate so as to seal a first end of the second through-hole.

7. The method of claim 1, further comprising:
   monitoring a sputtering condition within the sputtering apparatus;
   determining whether a fluctuation in the monitored sputtering condition is detected; and
   halting the sputtering of the target in response to determining that the fluctuation in the monitored sputtering condition is detected.

8. The method of claim 7, wherein the monitored sputtering condition comprises a voltage and/or a current applied to the sputtering target assembly.

9. The method of claim 7, wherein the monitored sputtering condition comprises a vacuum level within the deposition chamber.

10. The method of claim 7, wherein the fluctuation in the sputtering condition is generated by a fluid contained in an aperture entering the deposition chamber.

11. A sputtering method comprising:
inserting a sputtering target assembly into a deposition chamber of a sputtering apparatus, the sputtering target assembly comprising:
a backing plate having a through-hole formed therein;
a metal foil attached to a back surface of the backing plate so as to seal a first end of the through-hole; and
a target bonded to a front surface of the backing plate, such that a second end of the through-hole is sealed by a portion of the target that is predicted by a sputtering target erosion profile to have a highest etching rate during a corresponding sputtering process,
sputtering the target;
using an optical detection system to detect deformation of the metal foil; and
halting the sputtering of the target in response to detecting that the metal foil is deformed.

12. The method of claim 11, wherein the sputtering the target comprises etching the target until the second end of the through-hole is unsealed.

13. The method of claim 11, further comprising attaching the metal foil to the back surface of the backing plate using an adhesive or by welding.

14. The method of claim 11, wherein the metal foil comprises aluminum foil.

15. The method of claim 14, wherein the using an optical detection system to detect the deformation of the metal foil comprises detecting deformation of the metal foil into the through-hole.

16. The method of claim 11, further comprising:
monitoring a sputtering condition within the sputtering apparatus;
determining whether a fluctuation in the monitored sputtering condition is detected; and
halting the sputtering of the target in response to determining that the fluctuation in the monitored sputtering condition is detected.

17. The method of claim 16, wherein the monitored sputtering condition comprises a voltage and/or a current applied to the sputtering target assembly.

18. The method of claim 16, wherein the monitored sputtering condition comprises a vacuum level within the deposition chamber.

19. The method of claim 16, wherein the fluctuation in the sputtering condition is generated by a fluid contained in an aperture entering the deposition chamber.

20. A sputtering method comprising:
inserting a sputtering target assembly into a deposition chamber of a sputtering apparatus, the sputtering target assembly comprising:
a backing plate having a through-hole formed therein;
a metal foil attached to a back surface of the backing plate so as to seal a first end of the through-hole; and
a target bonded to a front surface of the backing plate, such that a second end of the through-hole is sealed by a portion of the target;
sputtering the target until the second end of the through-hole is unsealed;
detecting deformation of the metal foil into the unsealed through-hole; and
halting the sputtering of the target in response to detecting that the metal foil is deformed.

* * * * *